(12) United States Patent
Lee et al.

(10) Patent No.: US 12,093,176 B2
(45) Date of Patent: *Sep. 17, 2024

(54) MEMORY CIRCUIT AND CACHE CIRCUIT CONFIGURATION

(71) Applicant: Taiwan Semiconductor Manufacturing Company, Ltd., Hsin-Chu (TW)

(72) Inventors: Hsien-Hsin Sean Lee, Duluth, GA (US); William Wu Shen, Hsinchu (TW); Yun-Han Lee, Hsinchu County (TW)

(73) Assignee: TAIWAN SEMICONDUCTOR MANUFACTURING COMPANY, LTD, Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/341,088

(22) Filed: Jun. 26, 2023

(65) Prior Publication Data

US 2023/0333981 A1 Oct. 19, 2023

Related U.S. Application Data

(60) Continuation of application No. 17/568,199, filed on Jan. 4, 2022, now Pat. No. 11,687,454, which is a
(Continued)

(51) Int. Cl.
*G06F 12/0891* (2016.01)
*G06F 12/0804* (2016.01)
(Continued)

(52) U.S. Cl.
CPC ...... *G06F 12/0804* (2013.01); *G06F 12/0891* (2013.01); *G11C 5/025* (2013.01);
(Continued)

(58) Field of Classification Search
CPC ............. G06F 12/0804; G06F 12/0891; G06F 2212/1008; G06F 2212/1032;
(Continued)

(56) References Cited

U.S. PATENT DOCUMENTS 5,721,862 A 2/1998 Sartore et al.
5,778,422 A 7/1998 Genduso et al.
(Continued)

FOREIGN PATENT DOCUMENTS

KR 1999-026157 4/1999
KR 10-0268204 10/2000

OTHER PUBLICATIONS

Korean Patent Office, Korean Notice of Allowance of Patent, dated Oct. 30, 2014 and English translation from corresponding Application No. KR 10-2013-0000172.
(Continued)

*Primary Examiner* — Tha-O H Bui
(74) *Attorney, Agent, or Firm* — HAYNES AND BOONE, LLP

(57) ABSTRACT

A memory system includes multiple groups of primary memory cells residing in a first die or a stack of first dies, multiple groups of cache memory cells residing in a second die, an interposer, and control circuits residing in a third die. Each group of the cache memory cells is associated with a corresponding group of the primary memory cells. The first die or the stack of first dies is coupled to a top surface of the second die through a first group of bumps. A bottom surface of the second die is coupled to a top surface of the interposer through a second group of bumps. The control circuits are associated with the primary memory cells and the cache memory cells. The third die is positioned aside the second die and coupled to the top surface of the interposer through a third group of pumps.

20 Claims, 6 Drawing Sheets

Related U.S. Application Data continuation of application No. 16/587,215, filed on Sep. 30, 2019, now Pat. No. 11,216,376, which is a continuation of application No. 15/248,093, filed on Aug. 26, 2016, now Pat. No. 10,430,334, which is a division of application No. 13/667,924, filed on Nov. 2, 2012, now Pat. No. 9,431,064.

(51) Int. Cl.
  *G11C 5/02* (2006.01)
  *G11C 5/04* (2006.01)
  *G11C 7/22* (2006.01)

(52) U.S. Cl.
  CPC ............... *G11C 5/04* (2013.01); *G11C 7/22* (2013.01); *G06F 2212/1008* (2013.01); *G06F 2212/1032* (2013.01); *G06F 2212/45* (2013.01); *G06F 2212/608* (2013.01); *H01L 2224/16225* (2013.01); *H01L 2924/15311* (2013.01)

(58) Field of Classification Search
  CPC .......... G06F 2212/45; G06F 2212/608; G11C 5/025; G11C 5/04; G11C 7/22; H01L 2224/16225; H01L 2924/15311; G09B 21/004; G09F 7/14; G09F 7/16
  USPC .................................................. 365/230.05
  See application file for complete search history.

(56) References Cited

U.S. PATENT DOCUMENTS

| | | | |
|---|---|---|---|
| 5,786,628 A | 7/1998 | Beilstein et al. | |
| 6,078,532 A | 6/2000 | Rivers et al. | |
| 7,120,754 B2 | 10/2006 | Ryan et al. | |
| 7,623,365 B2* | 11/2009 | Jeddeloh | H01L 25/0657 365/189.02 |
| 7,861,055 B2 | 12/2010 | Pong | |
| 7,962,695 B2* | 6/2011 | Faucher | G06F 12/0893 711/E12.043 |
| 8,032,711 B2 | 10/2011 | Black et al. | |
| 8,547,775 B2 | 10/2013 | Yoko | |
| 8,924,645 B2* | 12/2014 | Chang | G06F 1/3268 711/E12.017 |
| 9,026,736 B1 | 5/2015 | Venkat | |
| 9,431,064 B2 | 8/2016 | Lee et al. | |
| 10,197,626 B2* | 2/2019 | Whetsel | G01R 31/318508 |
| 2006/0083047 A1* | 4/2006 | Fujita | G11C 14/0081 365/145 |
| 2010/0327419 A1* | 12/2010 | Muthukumar | H01L 25/18 257/E25.027 |
| 2012/0151232 A1 | 6/2012 | Fish, III | |
| 2012/0210066 A1 | 8/2012 | Joshi et al. | |
| 2017/0315171 A1 | 11/2017 | Whetsel | |

OTHER PUBLICATIONS

Korean Patent Office, Korean Office Action dated Mar. 31, 2014 and English translation from corresponding Application No. KR 10-2013-0000172.

Zhao Zhang et al., "Cached DRAM for ILP Processor Memory Access Latency Reduction," 2001 IEEE, pp. 22-32.

Doug Hyuk Woo et al., "Heterogeneous Die Stacking of SRAM Row Cache and 3-D DRAM: An Empirical Design Evaluation", Proc. of the 5th IEEE Intl. Midwest Symp. On Circuits and Systems, 2011.

O. Temam., et al., "Using Virtual Lines to Enhance Locality Exploitation", In Proc. of the Intl. Conf. on Supercomputing, pp. 1-11.

Doug Hyuk Woo et al., "An Optimized 3D-Stacked Memory Architecture by Exploiting Excessive, High-Density TSV Bandwidth", Proc. of Intl. Symp. On High-Performance Computer Architecture, 2010.

Subbarao Palacharla et al., "Evaluating Stream Buffers as a Secondary Cache Replacement", 194, IEEE pp. 24-33.

Norman P. Jouppi, "Improving Direct-Mapped Cache Performance by the Addition of a Small Fully-Associative Cache and Prefetch Buffers", 1990 IEEE, pp. 388-397.

Kazutami Arimoto et al., "A Circuit Design of Intelligent Cache DRAM with Automatic Write-Back Capability", IEEE Journal of Solid-State Circuits, vol. 26, No. 4, Apr. 1911, pp. 560-565.

* cited by examiner

MEMORY CIRCUIT AND CACHE CIRCUIT CONFIGURATION

PRIORITY

This is a continuation of U.S. patent application Ser. No. 17/568,199, which is a continuation of U.S. patent application Ser. No. 16/587,215, issued U.S. Pat. No. 11,216,376, which is a continuation of U.S. patent application Ser. No. 15/248,093, issued U.S. Pat. No. 10,430,334, which is a divisional of U.S. patent application Ser. No. 13/667,924, issued U.S. Pat. No. 9,431,064, entitled "Memory Circuit and Cache Circuit Configuration," filed Nov. 2, 2012, the entire disclosures of which are incorporated herein by reference.

BACKGROUND

The semiconductor industry continues to improve the integration density of various electrical components (e.g., transistors, diodes, resistors, capacitors, etc.) by continual reduction in minimum feature size, which allows more components to be integrated into a given area. Also, to further increase the integration density within an integrated circuit (IC) package, new packaging technologies, such as 2.5 dimensional (2.5D) integrated circuit (IC) packaging or three dimensional (3D) IC packaging compared with conventional two-dimensional (2D) IC packaging, have begun to be developed. 2D IC packaging refers to binding one IC die on one packaging substrate, 2.5D IC packaging refers to bonding multiple IC dies on a common interposer, and 3D IC packaging refers to stacking multiple IC dies one over another.

Various types of circuits, which sometimes require different electrical/mechanical characteristics, do not have to all be manufactured on the same die using the same manufacturing process. In consolidating a processing unit and a memory circuit in a single IC packaging, 2.5D IC packaging and 3D IC packaging are capable of accommodating a greater number of input/output (I/O) terminals (also referred to as I/O pins) connecting the processing unit and the memory circuit than that of a system without using 2.5D IC packaging or 3D IC packaging.

BRIEF DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
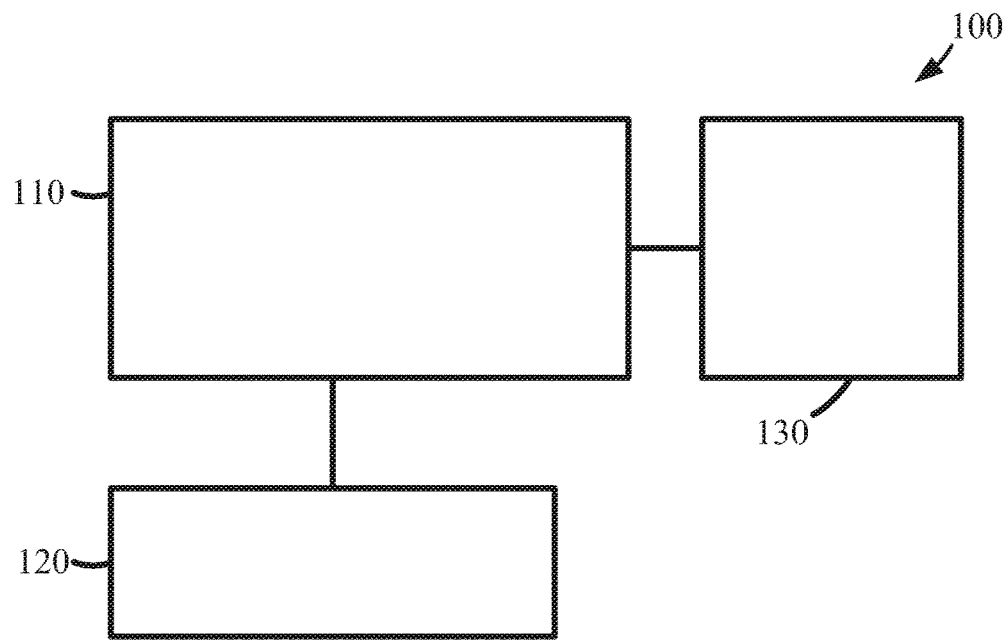
FIG. 1 is a system block diagram of a computing system in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.), are used for ease of the present disclosure of the relationship of features. The spatially relative terms are intended to cover different orientations of the device including the features.

FIG. 1 is a system block diagram of a computing system 100. The computing system 100 has a processing unit 110, a memory circuit 120, and other peripheral circuits collectively denoted as a circuit block 130. In some embodiments, the other peripheral circuits include input/output circuits, a display unit, a network interface circuit, and/or a storage device such as a hard drive or an optical disc drive. In some embodiments, the processing unit 110 includes a single processor. In some other embodiments, the processing unit 110 includes two or more processors. In some other embodiments, the memory circuit 120 is a static random access memory (SRAM), a dynamic random access memory (DRAM), or a non-volatile memory. In many applications, the processing unit 110 and the memory circuit 120 require different complexity and electrical characteristics, and manufacturing the processing unit 110 and the memory circuit 120 on the same die and/or according to the same manufacturing processes is not economically feasible.

Figure 2:
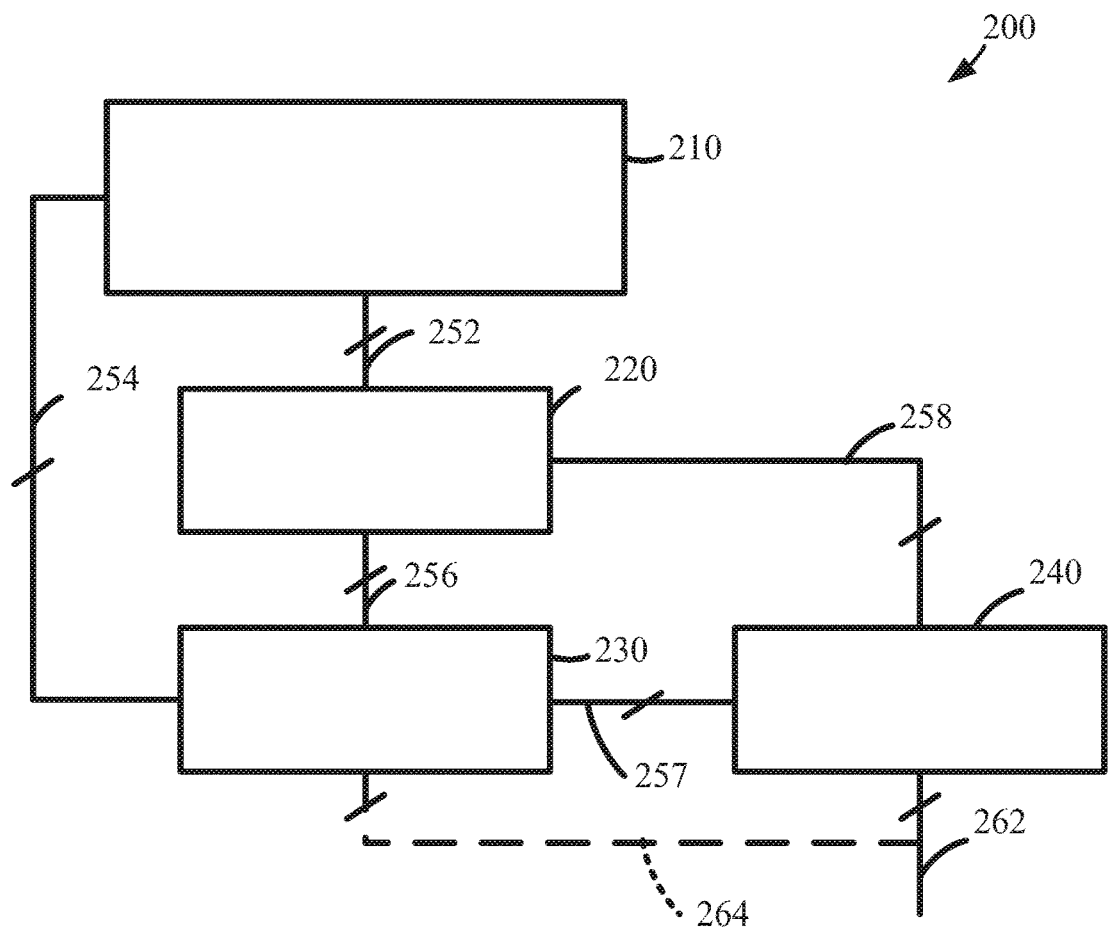
FIG. 2 is a system block diagram of a memory circuit in accordance with one or more embodiments.

FIG. 2 is a system block diagram of a memory circuit 200 in accordance with one or more embodiments. The memory circuit 200 includes a primary memory circuit 210, a cache memory circuit 220, a memory controller circuit 230, and a cache controller circuit 240. The primary memory circuit 210 is formed of one or more first dies. In some embodiments, the primary memory circuit 210 is formed of a single die. In yet some other embodiments, the primary memory circuit 210 is formed of multiple dies stacked one over another and having a 3D IC packaging configuration. The cache memory circuit 220 is formed of yet another die and coupled to the primary memory circuit 210 via bus 252. The primary memory circuit 210 includes memory cells of a first type, and the cache memory circuit 220 includes memory cells of a second type. In some embodiments, the memory cells of the second type are read and/or written at a speed faster than the memory cells of the first type. In some embodiments, the speed is measurable according to the time required from the receipt of a to-be-read address to the completion of the read operation of the data at the address.

In some embodiments, the memory cells of the first type are dynamic random-access memory (DRAM) cells, and the memory cells of the second type are static random-access memory (SRAM) cells. In some embodiments, the memory cells of the first type and the memory cells of the second type are SRAM cells but have different read speeds.

The memory controller circuit 230 is coupled to the primary memory circuit 210 via bus 254 and the cache memory circuit 220 via bus 256. The memory controller circuit 230 is usable to control the access of data stored in the primary memory circuit 210. The cache controller circuit 240 is coupled to the memory controller circuit 230 via bus 257 and the cache memory circuit 220 via bus 258. The cache controller circuit 240 receives a read command via bus 262 for reading data stored in the primary memory circuit 210 at a read address and/or receives a write command via bus 262 for writing data corresponding to a write address to the primary memory circuit 210. The cache controller circuit 240 determines if a valid duplication of the data exists in the cache memory circuit 220 and then optionally sends control signals via bus 257 to the primary memory circuit 210 if direct access to the primary circuit 210 is needed. Otherwise, the cache controller circuit 240 sends control signals via bus 258 to the cache memory circuit 220 without operating the memory controller circuit 230 and the primary memory circuit 210. In some embodiments, regardless whether the memory controller circuit 230 is going to be used in response to a read/write command, the address information are also sent to the memory controller circuit 230 via bus 264.

A duplication of data in the cache memory circuit 220 is valid if the duplication of data in the cache memory circuit 220 matches the corresponding original data stored in the primary memory circuit 210. In some embodiments, the addresses of the original data and the validity are recorded in the cache memory circuit 220.

In some embodiments, one or both of the memory controller circuit 230 and the cache controller circuit 240 are incorporated with the processing unit 110 (FIG. 1) and thus are omitted from the memory circuit 200. In some embodiments, the memory controller circuit 230 and the cache controller circuit 240 are integrated as a combined memory control circuit. In some embodiments, the primary memory circuit 210 and the cache memory circuit 220 are configurable to facilitate the access of data to/from the primary memory circuit 210 without assistance from the cache memory circuit 220 and the cache controller circuit 240. In at least one embodiment, the cache controller circuit 240 optionally bypasses the cache memory circuit 220 according to a setting provided to the cache controller circuit 240.

Figure 3:
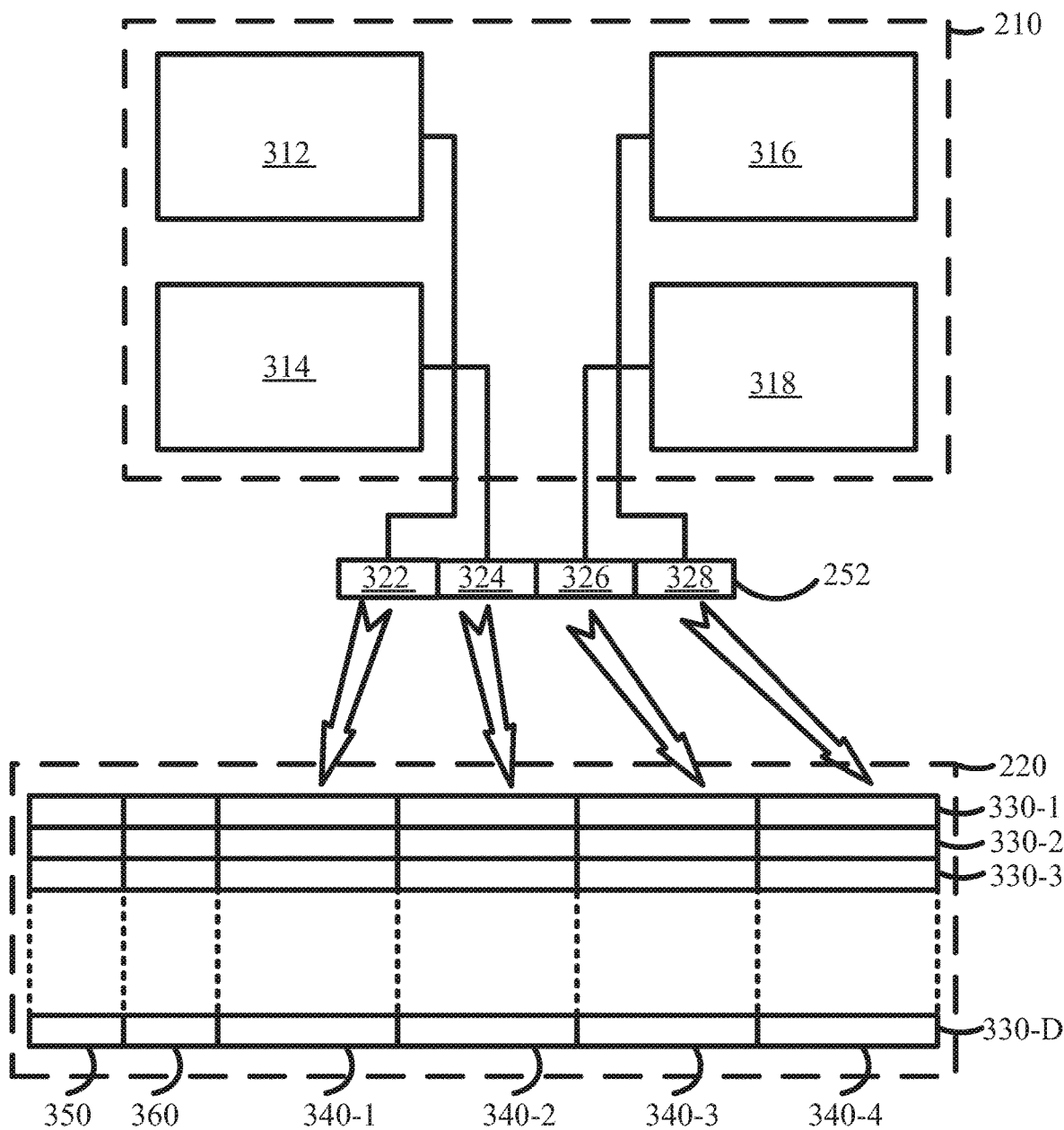
FIG. 3 is a functional block diagram of a primary memory circuit and a cache memory circuit in accordance with one or more embodiments.

FIG. 3 is a functional block diagram of a primary memory circuit 210 and a cache memory circuit 220 in accordance with one or more embodiments. The primary memory circuit 210 includes 4 sets of memory cells of the first type (312, 314, 316, and 318). Each set of the memory cells of the first type has Q input/output (I/O) terminals, and Q is an integer greater than 1. The Q-bit I/O terminals for the four sets of memory cells 312, 314, 316, and 318 are collectively denoted as I/O bus 252 including four corresponding access channels 322, 324, 326, and 328. In some embodiments, the primary memory circuit 210 includes P sets of memory cells of the first type, and P is an integer greater than 1. In some embodiments, the primary memory circuit 210 is operated to access Q bits of each one of the P sets of memory cells during a single read cycle or a single write cycle, and thus the primary memory circuit 210 has a P*Q bit I/O bus 252 with P*Q I/O pins. In some embodiments, the number P refers to the number of access channels of the primary memory circuit 210, and the number Q refers to the bandwidth of each access channel of the primary memory circuit 210. In at least one embodiment, P is 4, and Q is 128, and thus the primary memory circuit 210 is also referred to as having four access channels each having a 128-bit bandwidth. In some embodiments, the primary memory circuit 210 is a memory circuit in compliance with a JEDEC WIDE I/O Memory standard or a HYBRID MEMORY CUBIT (HMC) standard.

The cache memory circuit 220 includes a plurality of memory cells of the second type arranged into D rows (or sets) 330-1, 330-2, 330-3, . . . 330-D. Each set of the memory cells of the second type includes P (P equals four in the embodiment depicted in FIG. 3) subsets or cache sections (corresponding to the columns identified as 340-1, 340-2, 340-3, and 340-4) of Q*N memory cells of the second type. D and N are positive integers. In some embodiments, D ranges from 8 to 32. In some embodiments, N ranges from 1 to 32.

Each of the P subsets of memory cells of the second type 330-1, 330-2, 330-3, . . . 330-D is associated with a corresponding one of the P sets of memory cells of the first type 312, 314, 316, and 318. The cache controller circuit 240 stores P*Q bits of data from various sets of memory cells 312, 314, 316, and 318 during one read cycle. Moreover, the cache controller circuit 240 is also capable of performing pre-fetch of more consecutively addressed data from the P sets of memory cells 312, 314, 316, and 318 during up to the next (N−1) additional cycles. As such, each of the P subsets of memory cells of the second type 330-1, 330-2, 330-3, . . . 330-D holds up to N "bursts" of P*Q bits of data in total. In some embodiments, the number of "bursts" to be enabled or used is programmable by the cache controller circuit 240. In some embodiments, the number of "bursts" to be enabled or used is dynamically adjusted according to one or more software programs currently executed by the processing unit 110. In some embodiments, the number of "bursts" to be enabled or used is dynamically set according to a statistic record of how often the pre-fetch data is subsequently used and/or the additional cycles available between two read/write commands.

Each set of the memory cells of the second type 330-1, 330-2, 330-3, . . . 330-D further includes an address section (as represented by column 350) and a validity tag section (as represented by column 360). The address section 350 stores address information with which the stored duplication of data in the cache sections 340-1, 340-2, 340-3, and 340-4 are associated. In some embodiments, the address section 350 is divided into P sub-sections each for storing address information corresponding to one of the cache sections 340-1, 340-2, 340-3, and 340-4. The validity tag section 360 stores a value indicative of whether the cache sections 340-1, 340-2, 340-3, and 340-4 contain valid duplications of data. In some embodiments, the validity tag section 360 is divided into P sub-sections each for storing validity information corresponding to one of the cache sections 340-1, 340-2, 340-3, and 340-4. In some embodiments, the validity tag section 360 stores a value calculated based on the validity of the cache sections 340-1, 340-2, 340-3, and 340-4.

In some embodiments, the cache controller circuit 240 writes data corresponding to a write address to the primary memory circuit 210 in response to a write command received by the cache controller circuit 240. In at least one embodiment, the cache controller circuit 240 changes the values stored in the corresponding validity tag section 360 to invalidate a duplication of data stored in the cache memory circuit 220 corresponding to the write address.

In yet some other embodiments, the cache controller circuit 240 writes data corresponding to a write address to the cache memory circuit 220 in response to a write command received by the cache controller circuit 240 if a valid duplication of data corresponding to the write address is currently stored in the cache memory circuit 220. In at least one embodiment, the cache controller circuit 240 writes data stored in the cache memory circuit 220 corresponding to the write address to the primary memory circuit 210.

Figure 4A:
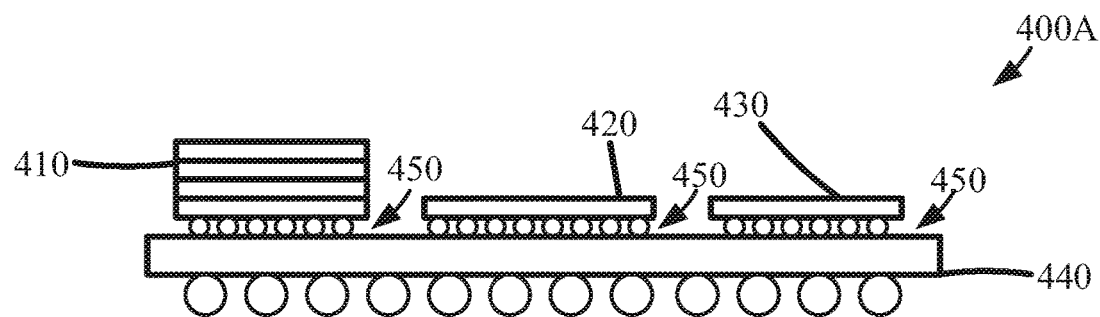
FIGS. 4A, 4B, and 4C are cross-sectional views of the memory circuit packaged using various types of packaging technology in accordance with one or more embodiments.
Figure 4B:
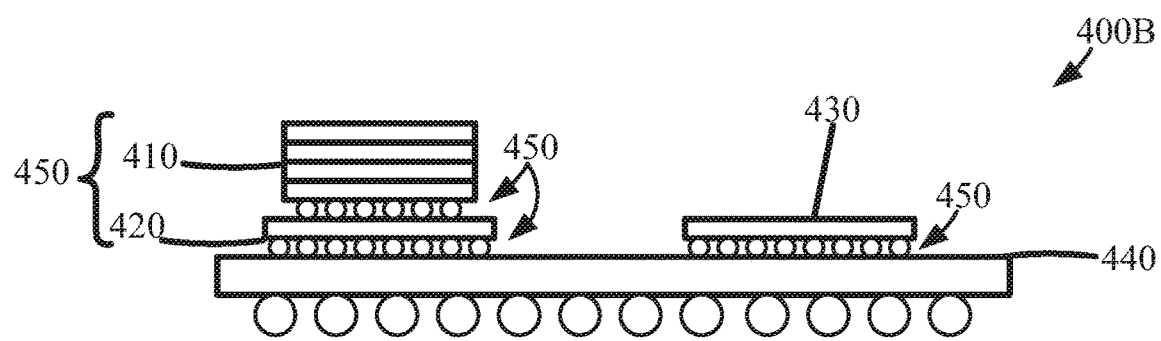
Figure 4C:
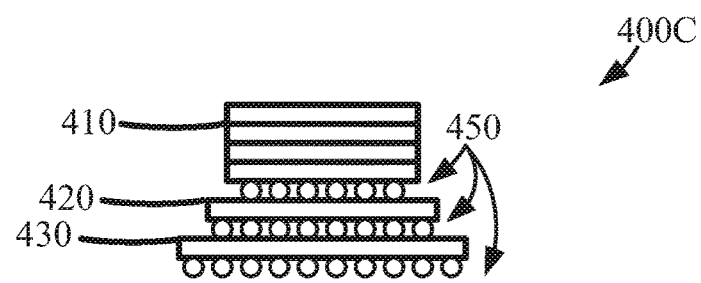

FIGS. 4A-C are cross-sectional views of the memory circuit 200 packaged using various types of packaging technology in accordance with one or more embodiments.

FIG. 4A is a cross-sectional view of a 2.5D IC package 400A of the memory circuit 200. The 2.5D IC package 400A includes a stacked memory dies 410 for the primary memory circuit 210, a cache memory die 420 for the cache memory circuit 220, and a logic die 430 corresponding to the memory controller circuit 230 and/or the cache controller circuit 240. In some embodiments, the stacked memory dies 410 has one or more dies. The stacked memory dies 410, the cache memory die 420, and the logic die 430 are mounted on an interposer 440 using a plurality of micro bumps 450. In some embodiments, the memory controller circuit 230 and the cache controller circuit 240 are formed of multiple dies. In some embodiments, other dies are also mounted on the interposer 450.

FIG. 4B is a cross-sectional view of a hybrid 2.5D/3D IC package 400B of the memory circuit 200. The hybrid IC package 400B includes a stacked memory dies 410 mounted on the cache memory die 420 using micro bumps 450 to form a 3D IC package 460 of the stacked memory dies 410 and the cache memory die 420. In some embodiments, the stacked memory dies 410 have/has one or more dies. Then, the 3D IC package 460 and the logic die 430 are mounted on the interposer 440.

FIG. 4C is a cross-sectional view of a 3D IC package 400C of the memory circuit 200. The 3D IC package 400c includes a stacked memory dies 410 mounted on the cache memory die 420, and in turn on the logic die to form a 3D IC package 400C.

Figure 5A:
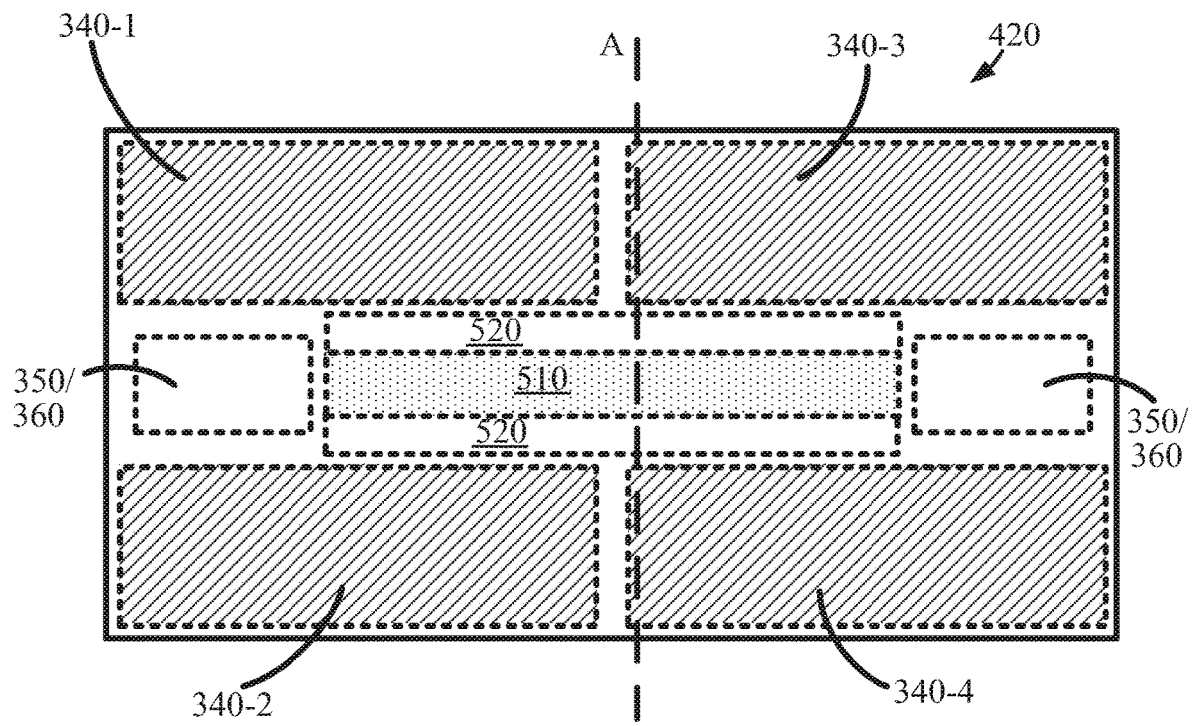
FIG. 5A is a top view of an example cache memory circuit in accordance with one or more embodiments.

FIG. 5A is a top view of an example configuration of the cache memory die 420 of the memory circuit 220 in accordance with one or more embodiments. The cache memory die 420 has memory cells divided into six groups of memory cells positioned toward the edges of the cache memory die 420. Four of the groups of memory cells correspond to the cache sections 340-1, 340-2, 340-3, and 340-4. Two of the groups of memory cells correspond to the address section 350 and the validity tag section 360 and each positioned between two corresponding groups of memory cells 340-1/340-2 and 340-3/340-4. A plurality of input/output terminals is in a central portion (areas 510 and 520) of the cache memory die 420. In some embodiments, the cache memory die 420 has memory cells divided into more or less than six groups of memory cells. In at least one embodiment, the cache memory die 420 has memory cells divided into a group of memory cells for all the cache sections 340-1, 340-2, 340-3, and 340-4 and another group of memory cells for both the address section 350 and the validity tag section 360.

Figure 5B:
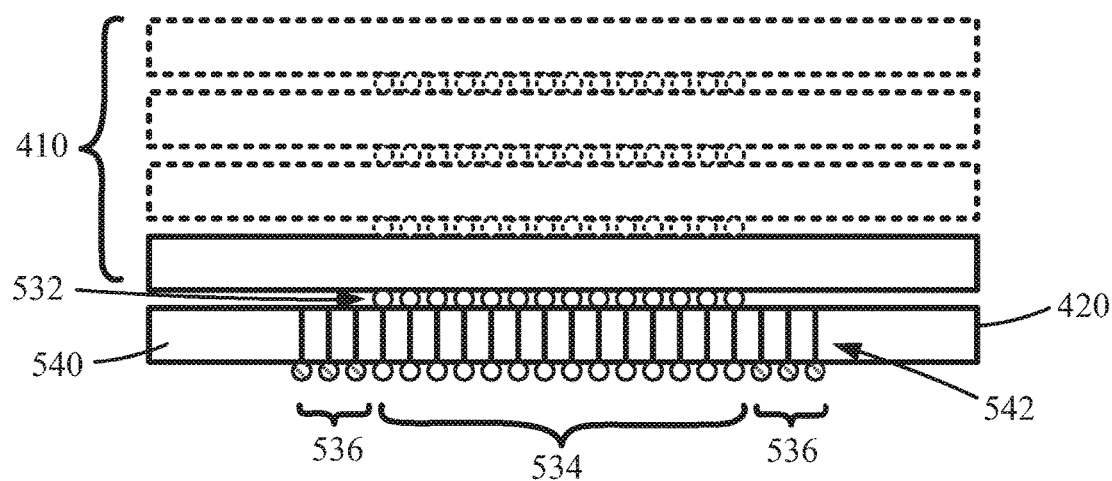
FIG. 5B is a cross-sectional view of the cache memory circuit of FIG. 5A stacked with a primary memory circuit in accordance with one or more embodiments.

FIG. 5B is a cross-sectional view of the cache memory die 420 of FIG. 5A, taken from line A, and the stacked memory dies 410 for the primary memory circuit 210 in accordance with one or more embodiments. The plurality of input/output terminals includes a first set of input/output terminals (as represented by micro bumps 532 occupying an area corresponding to area 510) on a first surface of the cache memory die 420. The first set of input/output terminals 532 are electrically connected to the stacked memory dies 410 of the primary memory circuit 210. The plurality of input/output terminals also includes a second set of input/output terminals (as represented by micro bumps 534 occupying an area corresponding to area 510 and micro bumps 536 occupying an area corresponding to area 510) on a second surface of the cache memory die. A portion of the second set of input/output terminals, such as the micro bumps 534, are pin-to-pin compatible with the first set of input/output terminals 532. The substrate 540 includes a plurality of through-silicon vias 542 electrically coupling the first set of input/output terminals 232 and the portion of the second set of input/output terminals 534.

Figure 6:
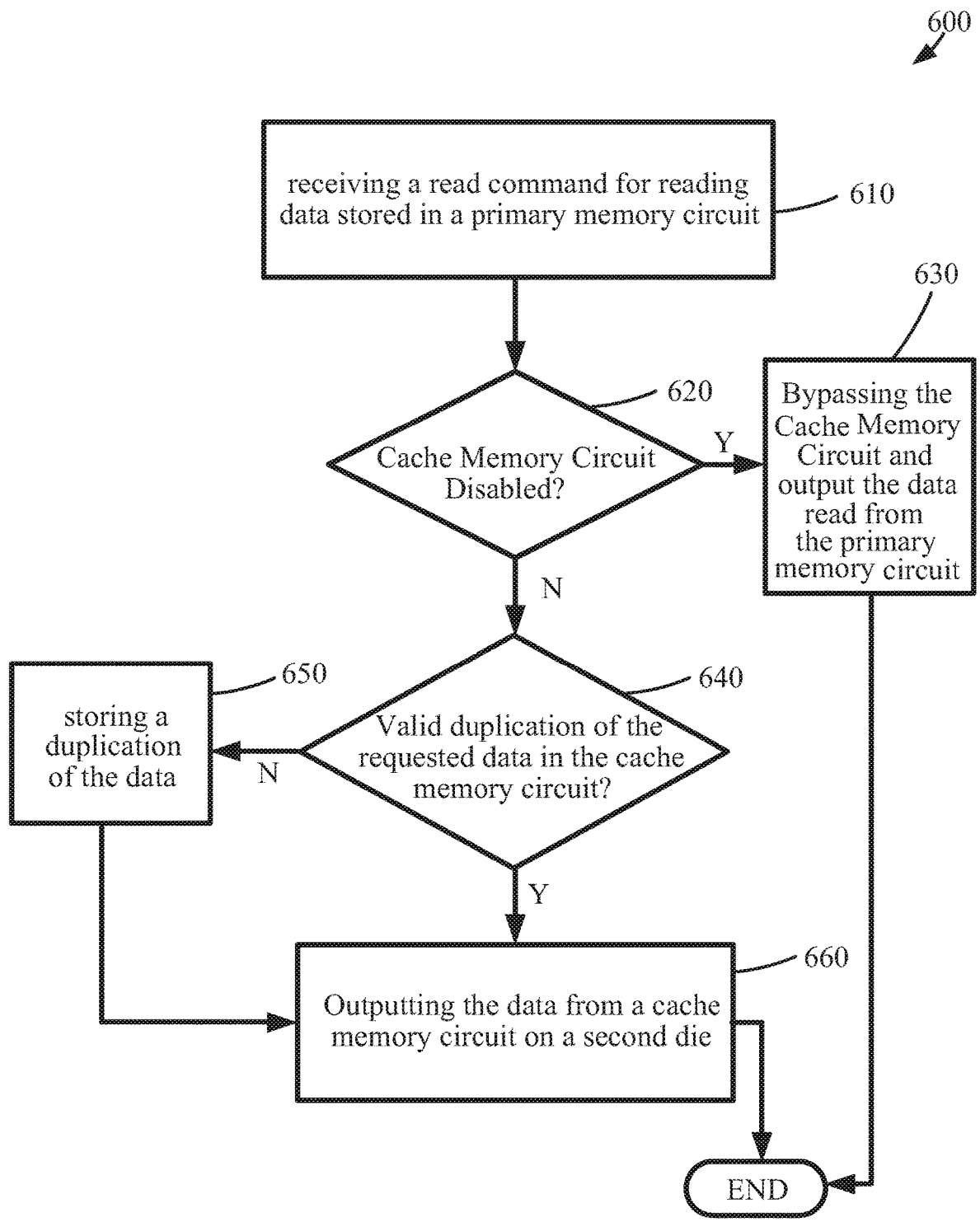
FIG. 6 is a flow chart of a method of reading data in response to a read command in accordance with one or more embodiments.

FIG. 6 is a flow chart of a method 600 of reading data in response to a read command in accordance with one or more embodiments. It is understood that additional processes may be performed before, during, and/or after the method 600 depicted in FIG. 6, and that some other processes may only be briefly described herein.

As depicted in FIG. 6 and FIGS. 2 and 3, in operation 610, the cache controller circuit 240 receives a read command for reading data stored in the primary memory circuit 210. The read command requests at least a first data accessible through a first access channel 322 of the primary memory circuit and a second data accessible through a second access channel 324 of the primary memory circuit 210.

The process moves on to operation 620, where the cache controller circuit 240 determines if the cache memory circuit 220 is going to be bypassed when processing the received read command. If it is determined that the cache memory circuit 220 is going to be bypassed, the process moves on to operation 630, where the cache controller circuit 240 sends control signals to the memory controller circuit 230 for reading the requested data from the primary memory circuit. In some embodiments, the determination of whether to bypass the cache memory circuit 220 is based on an external request received by the cache controller circuit 240 from the bus 262.

If it is determined that that the cache memory circuit 220 will not be bypassed, the process moves on to operation 640. In operation 640, the cache controller circuit 240 determines if a valid duplication of the first data and the second data is stored in the cache memory circuit 220.

In operation 650, if the valid duplication of the first data and the second data requested by the read command is not stored in the cache memory circuit 220, a duplication of $Q*n$ bits of consecutively addressed data from the access channel 322, a duplication of $Q*n$ bits of consecutively addressed data from the access channel 324, a duplication of $Q*n$ bits of consecutively addressed data from the access channel 326, and a duplication of $Q*n$ bits of consecutively addressed data from the access channel 328 are stored to the cache memory circuit 220. n is an integer from 1 to N. In some embodiments, in operation 650, not all access channels 322, 324, 326, and 328 are used.

In some embodiments, n is set according to an external request received by the cache memory controller 220. In some embodiments, the processing unit 110 determines the number n according to a likelihood of accessing data addressed nearby the data accessed in the previous read command when executing a particular set of executable instructions, e.g., a software program. The phenomenon of accessing data stored nearby the previously accessed data is also known as the "locality of memory accessing." Therefore, if the processing unit 110 acknowledges the software program currently being executed has a better locality of memory accessing, the number n is increased. To the contrary, if the processing unit 110 acknowledges the software program currently being executed has a poorer locality of memory accessing, the number n is decreased.

In some embodiments, n is set by the cache controller circuit 240 according to an access loading of the memory circuit 200. If the memory circuit 200 has low workload, the cache controller circuit 240 leverages the idle cycles before a next read or write command is received and attempts to pre-fetch as much data as possible. In some embodiments, the number n is dynamically adjusted according to one or more software programs currently executed by the processing unit 110.

After the data is pre-fetched by the cache memory circuit 220 or if the valid duplication of the first data and the second data requested by the read command is currently stored in the cache memory circuit 220, the cache controller circuit 240 outputs the requested first data and the requested second data from the cache memory circuit 220.

Figure 7:
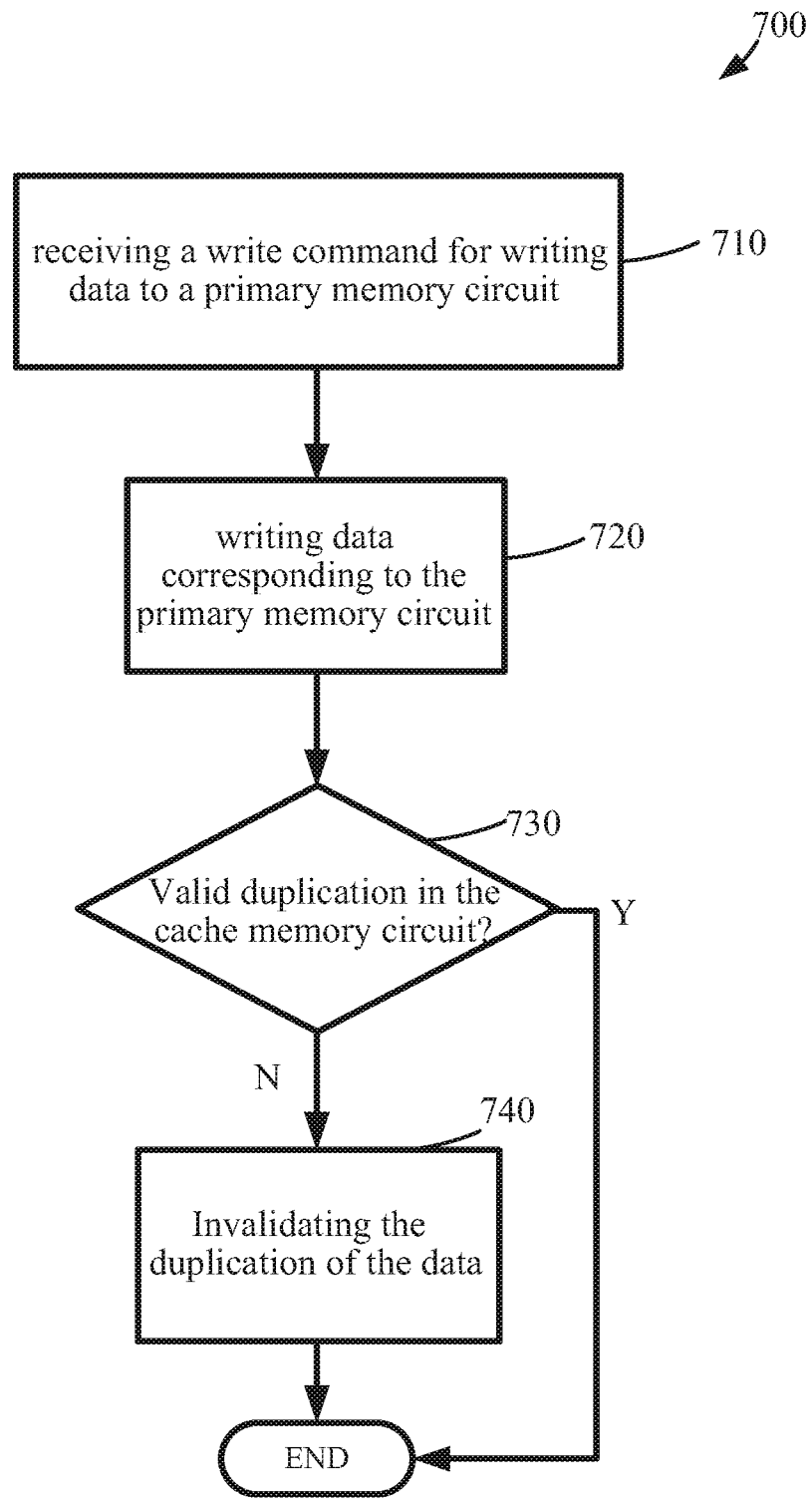
FIG. 7 is a flow chart of a method of writing data in response to a write command in accordance with one or more embodiments.

FIG. 7 is a flow chart of a method 700 of writing data in response to a write command in accordance with one or more embodiments. It is understood that additional processes may be performed before, during, and/or after the method 700 depicted in FIG. 7, and that some other processes may only be briefly described herein.

As depicted in FIG. 7 and FIGS. 2 and 3, in operation 710, the cache controller circuit 240 receives a write command for writing data to the primary memory circuit 210. The process moves on to operation 720, where the cache controller circuit 240 sends control signals to the memory controller 230 to write the data to the primary memory circuit 210 according to the address designated by the write command.

In operation 730, the cache controller circuit 240 determines if the cache memory circuit 220 has a valid duplication of the data. Because the data at the designated address in the primary memory circuit has just been updated, the duplication of the data in the cache memory circuit 220, if existing, is no longer deemed "valid." Therefore, in operation 740, if the valid duplication of the data is stored in the cache memory circuit 220, the validity tag is updated to invalidate the duplication of the data. On the other hand, if the cache memory circuit 220 does not have a valid duplication of the data, operation 740 is skipped.

In accordance with one embodiment, a memory circuit comprises a first memory circuit, a second memory, a memory controller, and a cache controller circuit. The first memory circuit is formed of a first die or a set of stacked dies, and the second memory circuit on a second die. The first memory circuit includes P sets of memory cells of a first type, and each set of the memory cells of the first type has Q input/output (I/O) terminals, and P and Q are integers greater than 1. The second memory circuit includes D set(s) of memory cells of a second type. Each set of the memory cells of the second type includes P subsets of Q*N memory cells of the second type, each of the P subsets of memory cells of the second type is associated with a corresponding one of the P sets of memory cells of the first type, and D and N are positive integers. The memory cells of the second type are readable at a speed faster than the memory cells of the first type. The memory controller circuit is coupled to the first memory circuit and the second memory circuit. The cache controller circuit is coupled to the memory controller circuit and the second memory circuit. The cache controller circuit receives a read command for reading data stored in the first memory circuit at a read address and retrieves the data from the second memory circuit if a valid duplication of the data requested by the read command exists in the second memory circuit.

In accordance with another embodiment, a cache memory die includes a substrate, a predetermined number of sets of memory cells on the substrate, a first set of input/output terminals on a first surface of the cache memory die, and a second set of input/output terminals on a second surface of the cache memory die. The first set of input/output terminals are connected to a primary memory circuit outside the cache memory die. A portion of the second set of input/output terminals are pin-to-pin compatible to the first set of input/output terminals.

In accordance with another embodiment, a method of operating a memory circuit includes determining, by a cache controller circuit in response to a read command for reading a first data accessible through a first access channel of the primary memory circuit and a second data accessible through a second access channel of the primary memory circuit, if a valid duplication of the first data and the second data is stored in the cache memory. The memory circuit comprises a primary memory circuit and a cache memory circuit. The primary memory circuit has P access channels of Q bits of channel bandwidth, and the cache memory circuit has P subsets of Q*N memory cells. P and Q are integers greater than 1, and N is a positive integer. The method further includes storing a duplication of Q*n bits of consecutively addressed data from the first access channel and a duplication of Q*n bits of consecutively addressed data from the second access channel to the cache memory circuit, if the valid duplication of the first data and the second data requested by the read command is not stored in the cache memory, n being an integer from 1 to N. The first data and the second data are output from the cache memory circuit if the valid duplication of the first data and the second data is stored in the cache memory circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory system, comprising:
   multiple groups of primary memory cells residing in a first die or a stack of first dies;
   multiple groups of cache memory cells residing in a second die, wherein each group of the cache memory cells is associated with a corresponding group of the primary memory cells, and wherein the first die or the stack of first dies is coupled to a top surface of the second die through a first group of bumps;
   an interposer, wherein a bottom surface of the second die is coupled to a top surface of the interposer through a second group of bumps; and
   control circuits residing in a third die, wherein the control circuits are associated with the primary memory cells and the cache memory cells, and wherein the third die is positioned aside the second die and coupled to the top surface of the interposer through a third group of pumps.

2. The memory system of claim 1, wherein the control circuits include a first control circuit coupled to the primary memory cells and a second control circuit coupled to the cache memory cells.

3. The memory system of claim 2, wherein the first control circuit also couples to the cache memory cells.

4. The memory system of claim 1, wherein the primary memory cells operate at a speed slower than the cache memory cells.

5. The memory system of claim 1, wherein the primary memory cells are dynamic random-access memory (DRAM) cells, and the cache memory cells are static random-access memory (SRAM) cells.

6. The memory system of claim 1, wherein the second group of bumps outnumbers the first group of bumps.

7. The memory system of claim 6, wherein the second group of bumps includes a first portion being pin-to-pin compatible with the first group of bumps and a second portion not corresponding to the first group of bumps.

8. The memory system of claim 7, wherein, in a top view of the second die, the first portion of the second group of bumps occupies a first strip region and the second portion of the second group of bumps occupies second and third strip regions that sandwich the first strip region.

9. The memory system of claim 7, wherein the first group of bumps is electrically coupled to the first portion of the second group of bumps by vias traveling through the second die.

10. The memory system of claim 1, further comprising:
a group of first memory cells residing in the second die and associated with addresses of data stored in the cache memory cells; and
a group of second memory cells residing in the second die and associated with validity of data stored in the cache memory cells.

11. A memory system, comprising:
a first die including a first memory circuit;
a second die including a second memory circuit, the first and second memory circuits being of different types, the first and second memory circuits being coupled to each other; and
a third die including a memory controller circuit and a cache controller circuit, the memory controller circuit coupled to the first memory circuit and the second memory circuit, and the cache controller circuit coupled to the second memory circuit and the memory controller circuit.

12. The memory system of claim 11, wherein the first memory circuit operates slower than the second memory circuit.

13. The memory system of claim 11, wherein the cache controller circuit is free of direct coupling with the first memory circuit.

14. The memory system of claim 11, wherein the cache controller circuit is operable to read data from the second memory circuit without operating the memory controller circuit.

15. The memory system of claim 11, further comprising:
a bus carrying read/write commands, wherein the bus is coupled to both the cache controller circuit and the memory controller circuit.

16. The memory system of claim 11, wherein the first memory circuit has P access channels of Q bits of channel bandwidth, and wherein the second memory circuit includes P subsets of Q*N memory cells, P and Q being integers greater than 1, N being a positive integer.

17. The memory system of claim 16, wherein the second die is operable to store a duplication of n*P*Q bits of consecutively addressed data from the first memory circuit to the second memory circuit, n being an integer from 1 to N and being dynamically set.

18. A memory system, comprising:
a primary memory circuit formed of a first die or a set of stacked dies, the primary memory circuit comprising P sets of primary memory cells, each set of the primary memory cells having Q input/output (I/O) terminals, P and Q being integers greater than 1;
a cache memory circuit formed of a second die, the cache memory circuit comprising D sets of cache memory cells, and each set of the cache memory cells comprising P subsets of Q*N cache memory cells, each of the P subsets of the cache memory cells associated with a corresponding one of the P sets of primary memory cells, D and N being positive integers;
a memory controller circuit electrically coupled with the primary memory circuit, the memory controller circuit being configured to access the P sets of primary memory cells; and
a cache controller circuit electrically coupled with the memory controller circuit and the cache memory circuit, the cache controller circuit being configured to receive a read command for reading requested data stored in the primary memory circuit at a read address and to retrieve a valid duplication of the requested data from the cache memory circuit if the valid duplication of the requested data exists in the cache memory circuit,
wherein the valid duplication of the requested data occupies n*P*Q cache memory cells in the cache memory circuit, n being an integer from 1 to N and being dynamically set.

19. The memory system of claim 18, wherein n is dynamically set according to how often a pre-fetch data is used or additional cycles available between two read/write commands.

20. The memory system of claim 18, wherein the first die or the set of stacked dies is stacked on the second die, and wherein the memory controller circuit and the cache controller circuit are formed of a third die.

* * * * *